(12) United States Patent
Chrysler et al.

(10) Patent No.: US 7,622,327 B2
(45) Date of Patent: Nov. 24, 2009

(54) COVERED DEVICES IN A SEMICONDUCTOR PACKAGE

(75) Inventors: Gregory M. Chrysler, Chandler, AZ (US); Tony A. Opheim, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 11/396,054

(22) Filed: Mar. 30, 2006

(65) Prior Publication Data

US 2007/0231969 A1    Oct. 4, 2007

(51) Int. Cl.
*H01L 21/00* (2006.01)
(52) U.S. Cl. .................. 438/106; 438/122; 438/125
(58) Field of Classification Search ............. 438/106, 438/110–112, 122, 124–127; 257/667, 675
See application file for complete search history.

(56) References Cited

U.S. PATENT DOCUMENTS

| | | | |
|---|---|---|---|
| 6,459,144 B1 * | 10/2002 | Pu et al. | 257/667 |
| 2003/0183909 A1 * | 10/2003 | Chiu | 257/667 |
| 2004/0130012 A1 * | 7/2004 | Hedler | 257/678 |
| 2005/0213301 A1 | 9/2005 | Prasher | |
| 2006/0118925 A1 * | 6/2006 | Macris et al. | 257/667 |

\* cited by examiner

*Primary Examiner*—Brook Kebede
(74) *Attorney, Agent, or Firm*—Blakely, Sokoloff, Taylor & Zafman LLP

(57) ABSTRACT

An embodiment of the present invention is a technique to fabricate a cover assembly. A cover has a base plate and sidewalls attached to perimeter of the base plate. The sidewalls have a height. A plurality of devices is attached to underside of the base plate. The devices have length corresponding to the height such that the devices are sealed within the cover when the cover is attached to a surface.

12 Claims, 8 Drawing Sheets

US 7,622,327 B2

COVERED DEVICES IN A SEMICONDUCTOR PACKAGE

BACKGROUND

1. Field of the Invention

Embodiments of the invention relate to the field of semiconductor, and more specifically, to semiconductor packaging.

2. Description of Related Art

In semiconductor packages, devices performing specific functions may be included in the packages. Examples of these devices may include thin film (TF) thermo-electric coolers (TFTECs) or sensors. The TFTECs are solid state cooling devices that offer higher cooling density, smaller form factor, and higher reliability than traditional bulk thermo-electric coolers. By matching the cooling density of the TFTEC to the size and the power density of the heat-generating source, cooling losses and overall power efficiencies may be increased. Due to superior performance, TFTECs are used on semiconductor dice to improve the thermal management performance in semiconductor packages.

Existing techniques to assemble TFTECs on dice have a number of disadvantages. A typical process first deposits an insulation layer on the die. Then, an interconnect pattern is placed on the insulation layer. The elements of the TFTEC are next soldered individually onto the interconnect pattern. The region around and between the TFTEC elements is then filled with an underfill or sealant to prevent the thermal interface material (TIM) from penetrating between the elements. The process is complex, requiring several steps. In addition, the use of the underfill or sealant may diminish the TFTEC cooling performance.

BRIEF DESCRIPTION OF THE DRAWINGS

Embodiments of invention may best be understood by referring to the following description and accompanying drawings that are used to illustrate embodiments of the invention. In the drawings.

DESCRIPTION

Figure 1A:
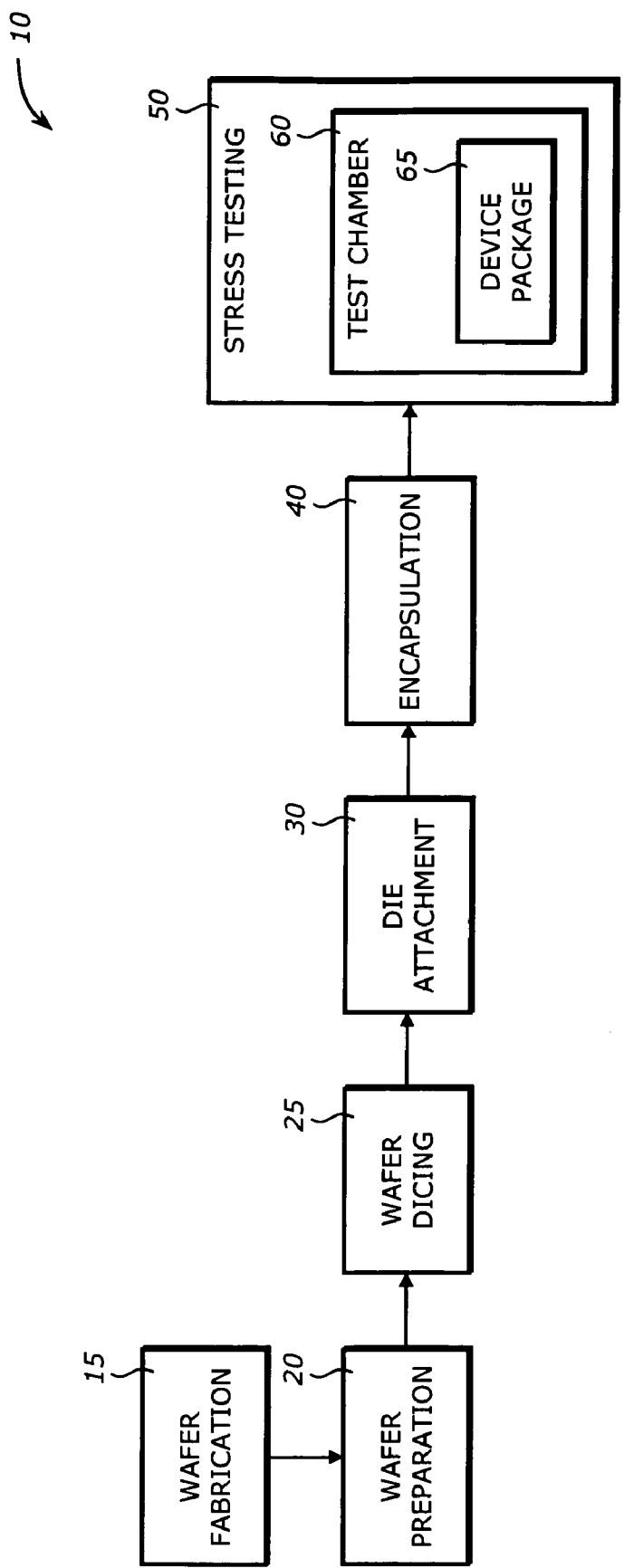
FIG. 1A is a diagram illustrating a manufacturing system in which one embodiment of the invention can be practiced.

An embodiment of the present invention is a technique to fabricate a cover assembly. A cover has a base plate and sidewalls attached to perimeter of the base plate. The sidewalls have a height. A plurality of devices is attached to underside of the base plate. The devices have length corresponding to the height such that the devices are sealed within the cover when the cover is attached to a surface.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to provide a cover assembly for devices on semiconductor packages. The devices may be thin film thermoelectric coolers (TFTECs). The TFTECs are enclosed in a cover or an enclosure. The individual TFTECs are assembled and attached to the underside of the cover. The cover assembly may then be attached to back side of a die or the underside of an integrated heat spreader (IHS). The cover assembly may be attached to the electrical interconnect pattern on the backside of the die or the underside of the IHS using a process similar to the flip-chip process. The cover assembly may be placed near hotspots of the die to cool the die efficiently. Since the entire TFTECs are sealed inside the cover, it is not necessary to use underfill or sealant between the elements of the TFTECs. In addition, the electrical insulation covering the elements of the TFTECs is not needed because the cover or enclosure provides the required insulation. The cover assembly having the TFTECs may be assembled inside the IHS at the IHS supplier. During the IHS manufacturing process, the electrical insulation and metal interconnect layers may be placed on the IHS. Then, the IHS with the cover assembly may be shipped to the semiconductor manufacturer for packaging. The cover assembly may also be attached to the die during the die fabrication process. The covered TFTECs may be positioned on strategic locations on the metal interconnect pattern on the backside of the die using a pick-and-place process. In either case, the complete cover assembly with the TFTECs is available as a single part ready to be attached to the die or the IHS. The solder TIM attachment is simplified because there is only one single cover assembly rather than individual TFTECs. This may reduce the potential for trapped air creating the solder TIM voids during the TIM soldering process.

Although the technique is described with the TFTEC, it is contemplated that any other devices with similar characteristics may be used. For example, devices such as pressure sensors, humidity sensors, etc. that may be used in multiple units may be attached to a cover or enclosure so that the multiple devices may be attached as a single unit to the backside of the die or the underside of the IHS.

FIG. 1A is a diagram illustrating a manufacturing system 10 in which one embodiment of the invention can be practiced. The system 10 includes a wafer fabrication phase 15, a wafer preparation phase 20, a wafer dicing phase 25, a die attachment phase 30, an encapsulation phase 40, and a stress testing phase 50. The system 10 represents a manufacturing flow of a semiconductor packaging process.

The wafer fabrication phase 15 fabricates the wafer containing a number of dice. The individual dice may be any microelectronic devices such as microprocessors, memory devices, interface circuits, etc. Each die may have a cover assembly having multiple devices (e.g., TFTECs) or multiple cover assemblies mounted on its back side. The wafer fabrication phase 15 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or copper. The various metal layers are interconnected by etching holes, called "vias," in the insulating material. During this phase, the cover assembly may be strategically mounted on each die together with the fabrication process for the circuit of the device.

The wafer preparation phase 20 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 25 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The die attachment phase 30 attaches the die to a package substrate. The substrate material depends on the packaging type. It may be lead-frame, plastic, or epoxy.

The encapsulation phase 40 encapsulates the die and the substrate. Depending on the packaging type, this may include molding, wire bonding, and solder ball attachment. Underfill material may be dispensed between the die and the substrate. Integrated heat spreader (IHS) may be attached to the die and substrate assembly. The encapsulated assembly of the die and substrate becomes a device package 65 ready to be tested. During this phase, a cover assembly may be mounted on, or attached to, the cavity side, or the underside, of the IHS.

The stress testing phase 50 performs one or more tests such as Highly Accelerated Stress Test (HAST) or biased-HAST on the device package under stress conditions. A test chamber 60 may be designed to conduct a stress test. It may have monitoring circuits, measurement circuits, and other data processing equipment. The package 65 is placed in the test chamber 60 subject to the stress test. It may be powered or non-powered. Various stress tests may be performed on the wafer or on the packaged devices 65 at various points of the manufacturing process flow. The tests may follow standards such as Joint Electron Device Engineering Council (JEDEC) standards or military standards. Examples of these tests may include electrostatic discharge (ESD), or human body model (HBM), high temperature operational life (HTOL), thermal shock, temperature cycle, high temperature storage, vibration and mechanical loading, shear testing, and accelerated moisture resistance.

Figure 1B:
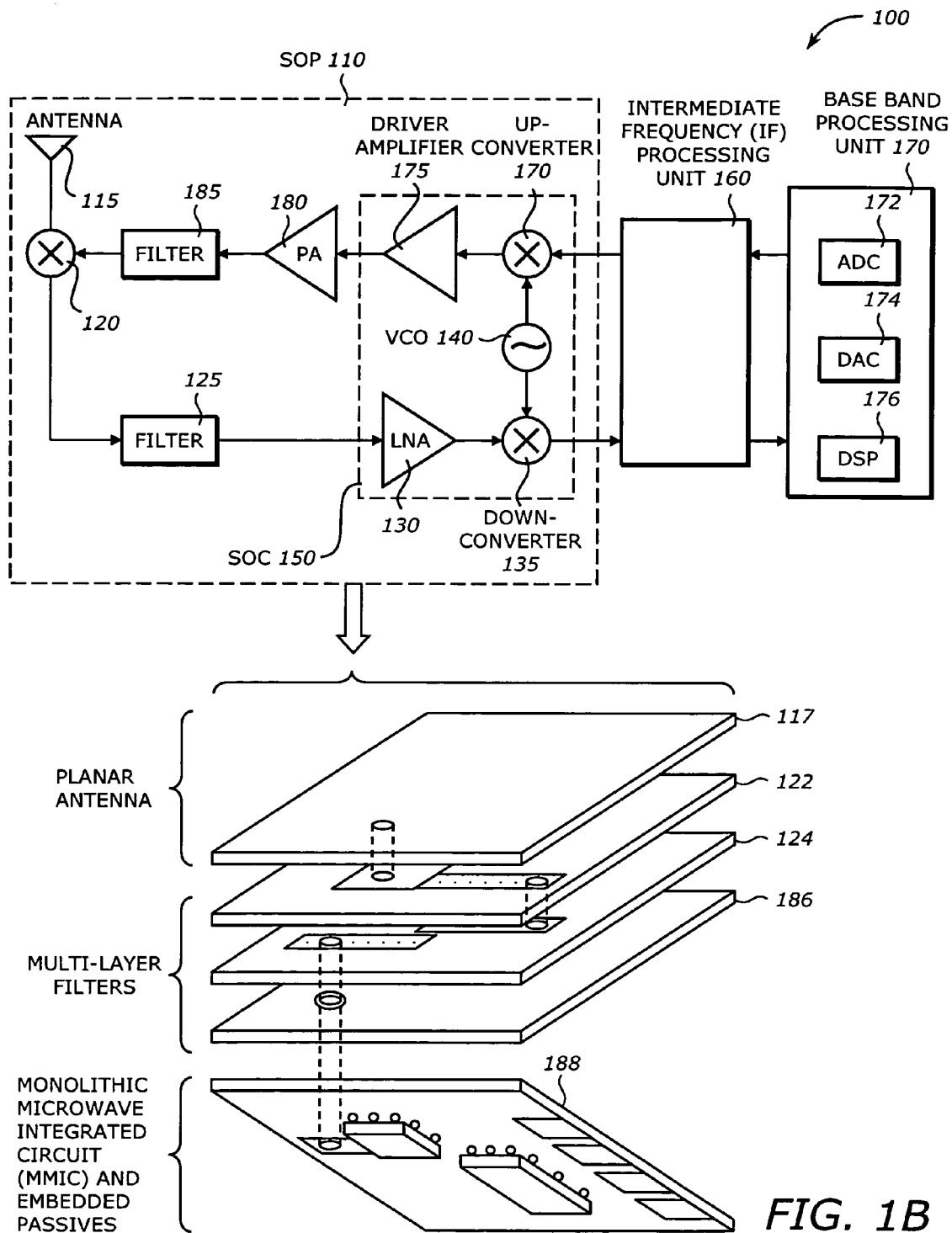
FIG. 1B is a diagram illustrating a system according to one embodiment of the invention.

FIG. 1B is a diagram illustrating a system 100 according to one embodiment of the invention. The system 100 represents a mobile communication module. It includes a system on package (SOP) 110, an intermediate frequency processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 150, a power amplifier (PA) 180, and a filter 185.

The antenna 115 receives and transmits RF signals. The RF signals may be converted to digital data for processing in subsequent stages. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 170, and a driver amplifier 175. The LNA 130 amplifies the received signal. The down converter 135 is a mixer to convert the RF signal to the IF band to be processed by the IF processing unit 160. The up converter 170 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, and a digital signal processor (DSP) 176. The ADC 172 and the DAC 174 are used to convert analog signals to digital data and digital data to analog signal, respectively. The DSP 176 is a programmable processor that may execute a program to process the digital data. The DSP 176 may be packaged using Flip-Chip Ball Grid Array (FCBGA) packaging technology or any other suitable packaging technologies. The DSP 176 may be manufactured according to the manufacturing flow 10 shown in FIG. 1A. It may be the device package 65. The base-band processing unit 170 may also include memory and peripheral components. The DSP 176 may, therefore, be coupled to the front end processing unit via the IF processing unit 160 and/or the base-band processing unit 170 to process the digital data.

The SOP 110 may be a multi-layer three-dimensional (3D) architecture for a monolithic microwave integrated circuit (MMIC) with embedded passives (EP) technology. It may be implemented using Low Temperature Co-fired Ceramics (LTCC) and organic-based technologies. The 3D architecture may include multiple layers include a layer 117 to implement the antenna 115, layers 122, 124, and 186 for the filters 125 and 185, and layer 188 for the SOC 150 and the passive components using EP technology. Typically, the packaging technology involves embedded passives with multiple layers.

Figure 2A:
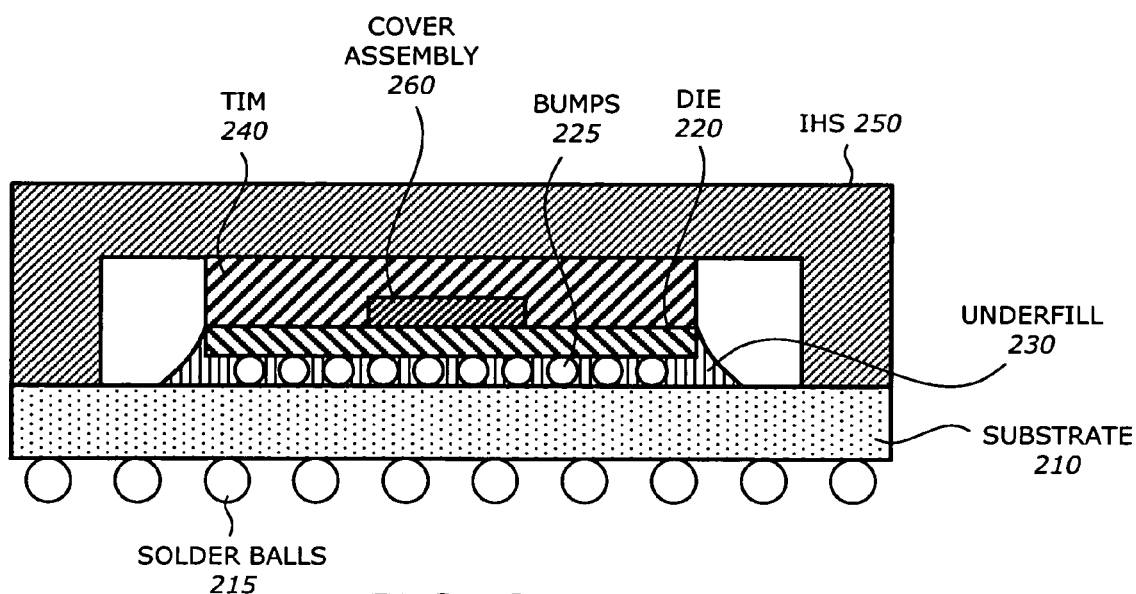
FIG. 2A is a diagram illustrating a package device having a cover assembly attached to the die according to one embodiment of the invention.

FIG. 2A is a diagram illustrating the package device 65 or 176 shown in FIG. 1A and FIG. 1B, respectively, having a cover assembly attached to the die according to one embodiment of the invention. The package device 65/176 includes a substrate 210, a die 220, an underfill 230, an integral heat spreader (IHS) 250, and a cover assembly 260.

The substrate 210 is a package substrate that provides support for the die 220. The substrate 210 may be polymer or a composite. The substrate 210 may be selected for any suitable packaging technologies including Ball Grid Array (BGA), Pin Grid Array (PGA), or Land Grid Array (LGA). The substrate 210 may be attached to a number of solder balls 215. The solder balls 215 allow attachment of the package device 165 to a circuit board or to any other mounting component. The die 220 is any semiconductor die. It may have a microelectronic device such as a microprocessor, a memory, an interface chip, an integrated circuit, etc. The die 220 is attached to the substrate 110 by a number of solder bumps 225. The bumps 225 provide contact with the contact pads on the substrate. The bumps 225 may be fabricated using any standard manufacturing or fabrication techniques such as the controlled collapse chip connect (C4) technique. The underfill 230 is dispensed between die 220 and the substrate 210 to strengthen the attachment of die 220 to the substrate 210 to help prevent the thermal stresses from breaking the connections between die 220 and the substrate 210. The stresses may be caused by the difference between the coefficients of thermal expansion of die 220 and the substrate 210. The underfill 230 may contain filler particles suspended in an organic resin. The size of the filler particles are typically selected according to a gap between the die 220 and the substrate 210, e.g., the filler particles have a diameter about one third the size of the gap. Generally, the composition and concentration of filler particles are selected to control the coefficient of thermal expansion and the shrinkage of the underfill 230.

The IHS 250 may house or cover the die 220 on the substrate 210. It may include a flat surface and supporting walls on both or four sides of the die 220. During operation, the die 220 may generate heat. The heat may be transferred to the IHS 250 through a thermal interface material (TIM) 240. The TIM 240 may be located, or interposed, between the bottom surface of the IHS 250 and the top surface of the die 220 to encapsulate the cover assembly 260. It may be attached to a heat generating device, such as the die 220, to transfer the heat to a heat spreader or a heat sink or any another heat dissipating device. The TIM 240 may be made of thermal grease, phase change material (PCM), pads, films, and gels, or any thermally conducting material such as Sn solder, or alloys, or a combination of such materials, which also show good adhesion (e.g., wetting) with the IHS 250 and the die 220.

The cover assembly 260 includes a cover and a number of devices (e.g., TFTECs). The TFTEC may be a solid state heat pump that operates on the Peltier effect. The TFTEC may include an array of p- and n-type semiconductor elements that act as two dissimilar conductors. The array of elements is connected between two metal interconnects, and may be connected in series and/or in parallel. As a direct current (DC) current passes through one or more pairs of elements from n- to p-, there is a decrease in temperature at the junction, resulting in the absorption of heat from the environment, e.g., from the die 220. The heat is carried through the TFTEC by electron transport and released on the opposite side as the electrons move from a high to low energy state. The cover assembly 260 is attached to the die via an interconnect pattern on the backside of the die. It receives power from the power contacts in the substrate 210.

Figure 2B:
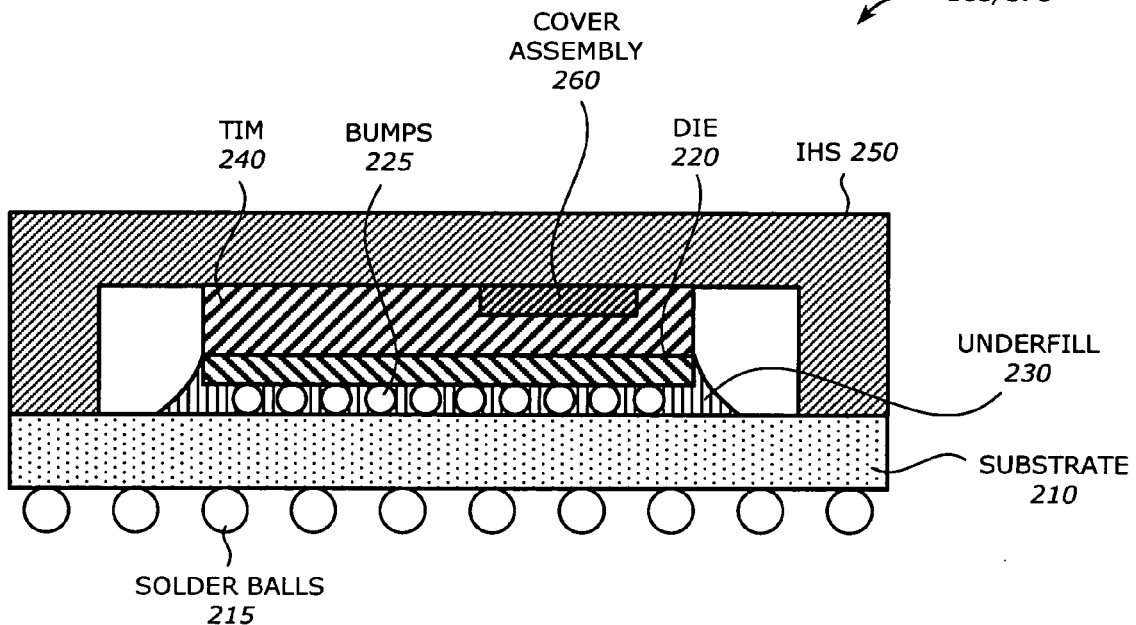
FIG. 2B is a diagram illustrating a package device having a cover assembly attached to the integrated heat spreader according to one embodiment of the invention.

FIG. 2B is a diagram illustrating the package device 65 or 176 shown in FIG. 1A and FIG. 1B, respectively, having a cover assembly attached to the underside of the IHS according to one embodiment of the invention. The package device 65/176 includes the substrate 210, the die 220, the underfill 230, the integral heat spreader (IHS) 250, and the cover assembly 260 as in FIG. 2A.

The substrate 210, the die 220, the underfill 230, the integral heat spreader (IHS) 250, and the cover assembly 260 are the same as described in FIG. 2A. The difference is that the cover assembly 260 is attached to the IHS 250 via an interconnect pattern on the underside or the cavity of the IHS 250. The attachment of the cover assembly 260 may be performed at the IHS manufacturing facility. In addition, when the devices are TFTECs, the arrangement of the TFTECs in the cover assembly 260 may be reversed as explained in FIGS. 5A and 5B.

Figure 3:
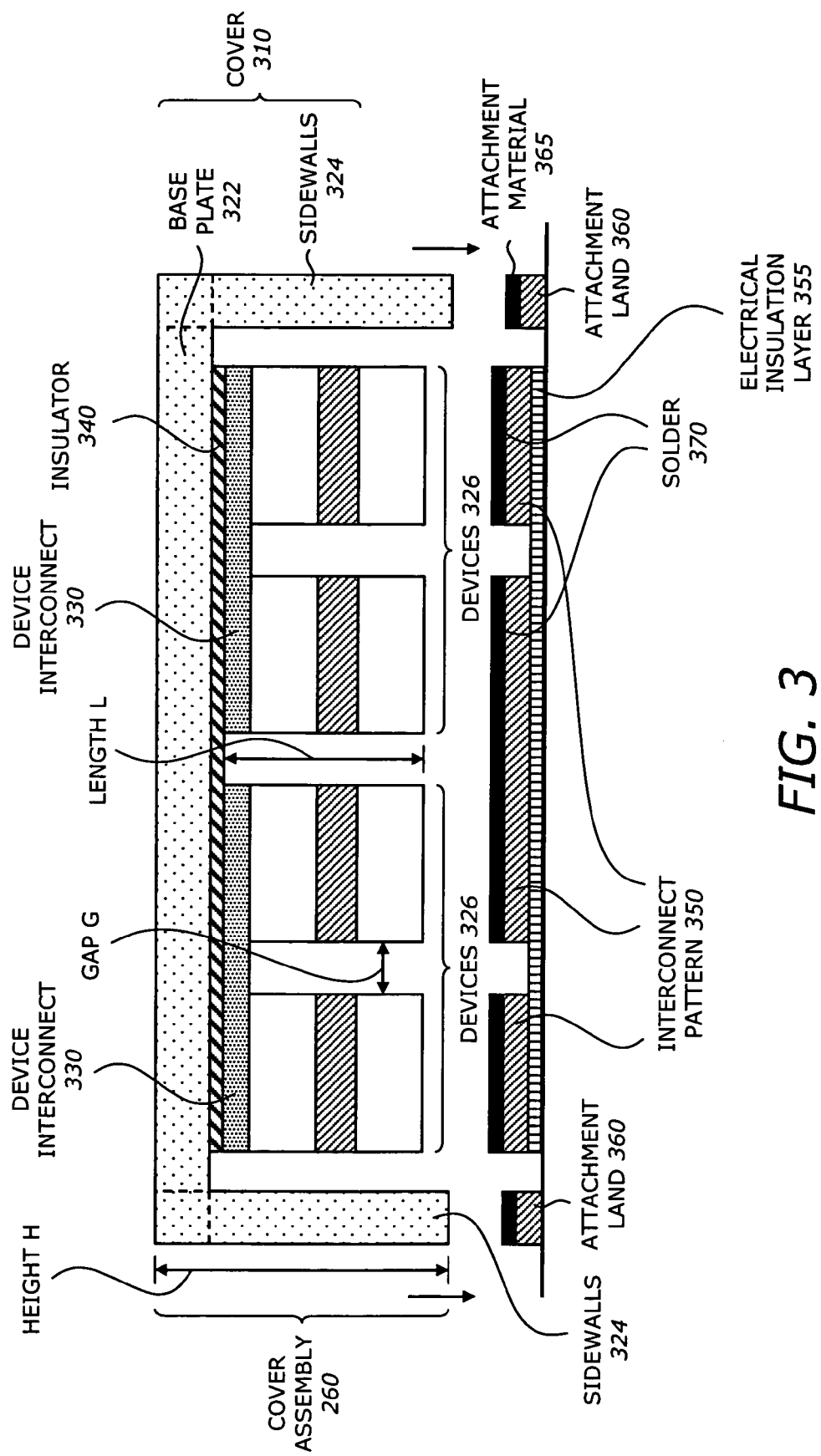
FIG. 3 is a diagram illustrating cross section of a cover assembly and its attachment to the die or the IHS according to one embodiment of the invention.

FIG. 3 is a diagram illustrating the cross section of the cover assembly 260 and its attachment to the die or the IHS according to one embodiment of the invention. The cover assembly 260 includes a cover 310 and a number of devices 326.

The cover 310 has a base plate 322 and sidewalls 324 attached to perimeter of the base plate 322. The sidewalls have a height H. Depending on the application, the base plate 322 and the sidewalls 324 may be made of the same material or different materials. When the devices 326 are the TFTECs, the base plate 322 is made of a thermally conductive material while the sidewalls 324 may be made of a different material. The thermally conductive material may be metal such as copper to allow efficient heat transfer.

The devices 326 are attached to the underside of the surface 322 which is internal to the cover. The devices have a length L corresponding to the height H of the sidewalls such that the entire devices 326 are completely sealed or enclosed inside the cover 310 when the cover 310 is attached to a surface such as the backside of the die or the underside of the IHS. When the devices are the TFTECs, they are attached to the underside of the base plate 322 though an electrical insulator layer 340. The individual TFTECs may have a device interconnect layer 340 to electrically connect them in groups such as in pairs. The individual TFTECs may be separated by a gap G. Since the cover 310 encloses the entire TFTECs in a sealed environment when it is attached to the die or the IHS, there is no need to fill the gap G with underfill or sealant.

The cover assembly 260 is attached to the backside of the die or the underside of the IHS as a single unit. This attachment process is therefore much simpler and more efficient than attaching individual devices 326. On the surface of the backside of the die or the underside of the IHS, there is an insulation layer 355 and an interconnect pattern 350. The interconnect pattern 350 is placed on the surface of the backside of the die or the underside of the IHS on the insulation layer 355 to correspond to the positions of the devices 326. When the interconnect pattern 350 is on the backside of the die, its location is selected to correspond to the hotspots of the die. The interconnect pattern 350 may have leads that are plated or sputtered and pass through the edge of the cover to provide power to the devices 326. In addition, there are attachment lands 360 around the interconnect pattern 350. These attachment lands 360 correspond to the sidewalls 324.

When the cover assembly 260 is attached to the backside of the die or the underside of the IHS, the devices are attached or soldered to the interconnect pattern 350 and the sidewalls 324 are attached to the attachment lands 360. A layer of solder or attachment material 370 is deposited on the interconnect pattern 350. In addition, an attachment material 365, such as solder, epoxy or glue sealant, is dispensed on the attachment lands 360. The attachment process may be performed using the flip-chip process. The height H of the sidewalls is selected such that when the cover assembly is attached to the die or the IHS, the entire set of devices 326 are completely sealed within the cover 310. The height H is selected such that the total height of the sidewalls 324 and the attachment lands 360 is approximately equal to the length L of the devices and the height of the interconnect pattern 350.

Figure 4:
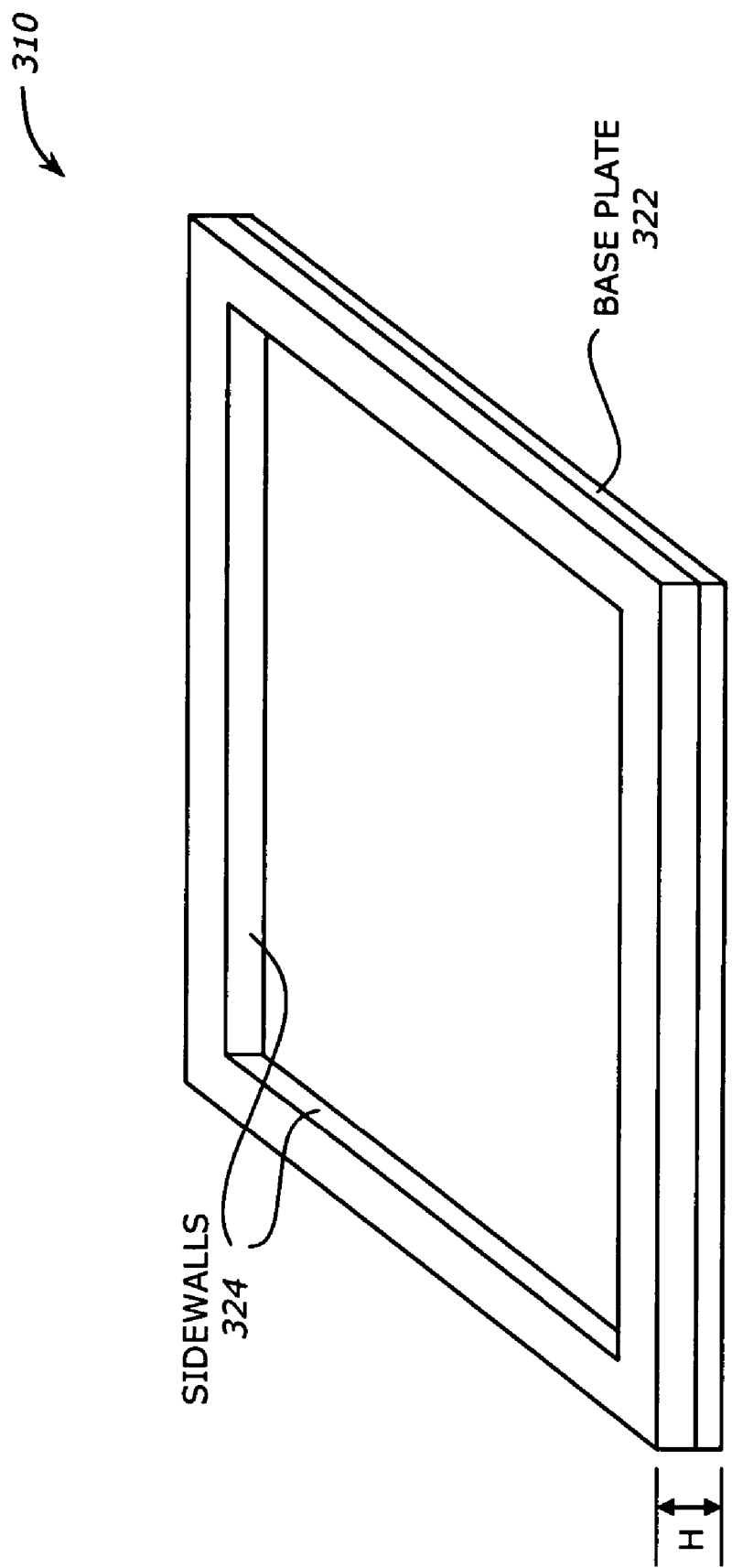
FIG. 4 is a diagram illustrating a cover in the cover assembly according to one embodiment of the invention.

FIG. 4 is a diagram illustrating the cover 310 in the cover assembly according to one embodiment of the invention. The cover 310 may have any desired shape that matches to the desired geometry of the placement of the devices. The shape of the cover 310 may be circular, square, rectangular, hexagonal, or any other shape that may accommodate the proper placement of the devices.

FIG. 4 shows the cover 310 without the devices in a rectangular shape. As shown, there are four sidewalls 324 attached to the perimeter of the base plate 322. The base plate 322 may be a thin plate of a first material. For TFTECs, the first material is a thermally conductive material such as copper. The sidewalls 324 may be made of a second material different from the first material. The sidewalls 324 have the height H selected to provide complete sealing of the devices when the cover 310 is attached to the backside of the die or the underside of the IHS.

Figure 5A:
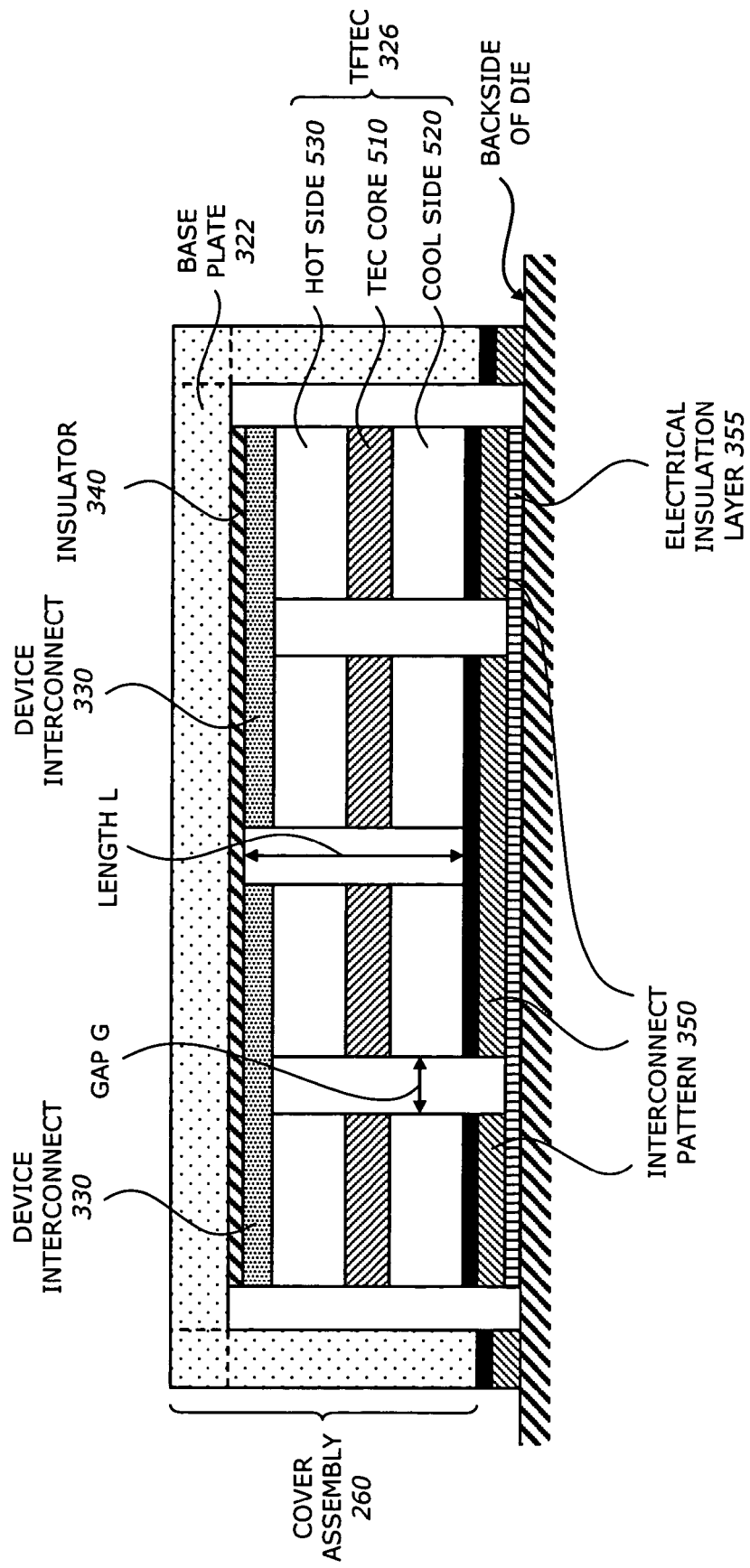
FIG. 5A is a diagram illustrating an arrangement of the TFTECs in the cover when attached to backside of a die according to one embodiment of the invention.

FIG. 5A is a diagram illustrating an arrangement of the TFTECs in the cover when attached to backside of a die according to one embodiment of the invention.

As discussed above, the TFTEC 326 may include an array of p- and n-type semiconductor elements that act as two dissimilar conductors. The TFTEC 326 has a TEC core 510, a cool side 520, and a hot side 530. The TFTEC 326, when energized, operates to transfer the heat generated from the die to the cool side 520 and then out to the hot side 530.

When the TFTECs 326 are attached to the backside of the die as shown in FIG. 5A, the cool side 520 is attached to the interconnect pattern 350 on the backside of the die and the hot side 530 is attached to the underside of the base plate 322 of the cover 310.

Figure 5B:
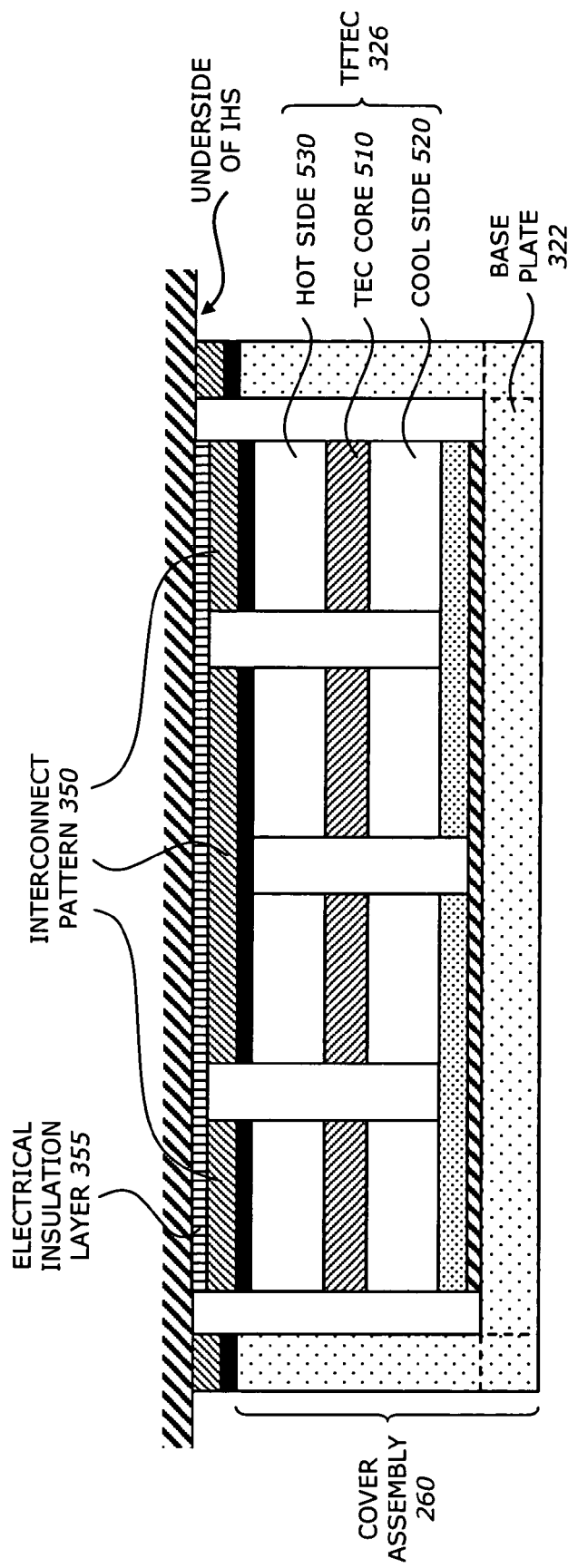
FIG. 5B is a diagram illustrating an arrangement of the TFTECs in the cover when attached to underside of an IHS according to one embodiment of the invention.

FIG. 5B is a diagram illustrating an arrangement of the TFTECs in the cover when attached to underside of an IHS according to one embodiment of the invention.

When the cover assembly 260 is attached to the underside of the IHS, it is turned upside down compared to when it is attached to the backside of the die. Therefore, the TFTECs are also attached in reverse. The cool side 520 is attached to the underside of the base plate 322 of the cover 310 and the hot side 530 is attached to the interconnect pattern 350 on the underside of the IHS.

In either case, the heat flows from the die, into the cool side 520 of the TEC elements, out of the hot side 530 of the TEC elements and finally into the IHS.

Figure 6:
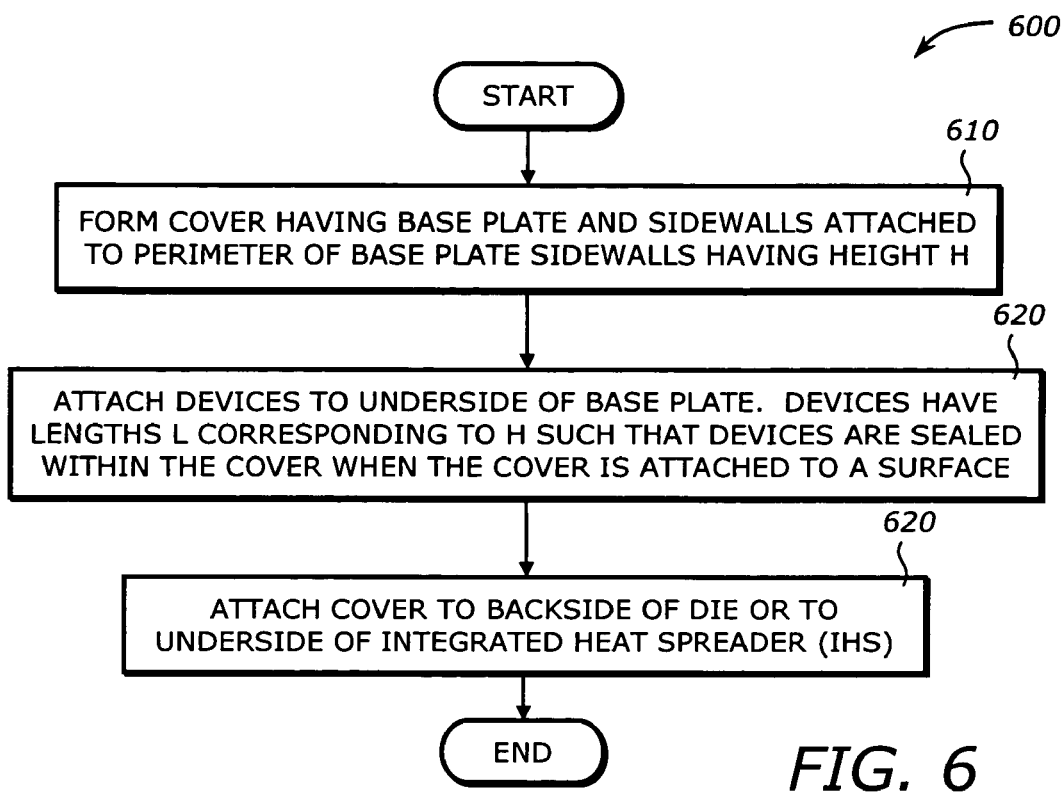
FIG. 6 is a flowchart illustrating a process to fabricate a cover assembly according to one embodiment of the invention.

FIG. 6 is a flowchart illustrating a process 600 to fabricate a cover assembly according to one embodiment of the invention.

Upon START, the process 600 forms a cover having a base plate and sidewalls attached to perimeter of the base plate (Block 610). The sidewalls have a height. Then, the process 500 attaches a number of devices to the underside of the base plate (Block 620). The devices have length corresponding to the height such that the devices are enclosed or sealed within the cover when the cover is attached to a surface.

Next, the process 600 attaches the cover to the backside of a die or to the underside of an integrated heat spreader (IHS) (Block 630). The attachment process may be similar to the flip-chip attachment process. The attachment is such that the devices are completely sealed within the cover. The process 600 is then terminated.

Figure 7:
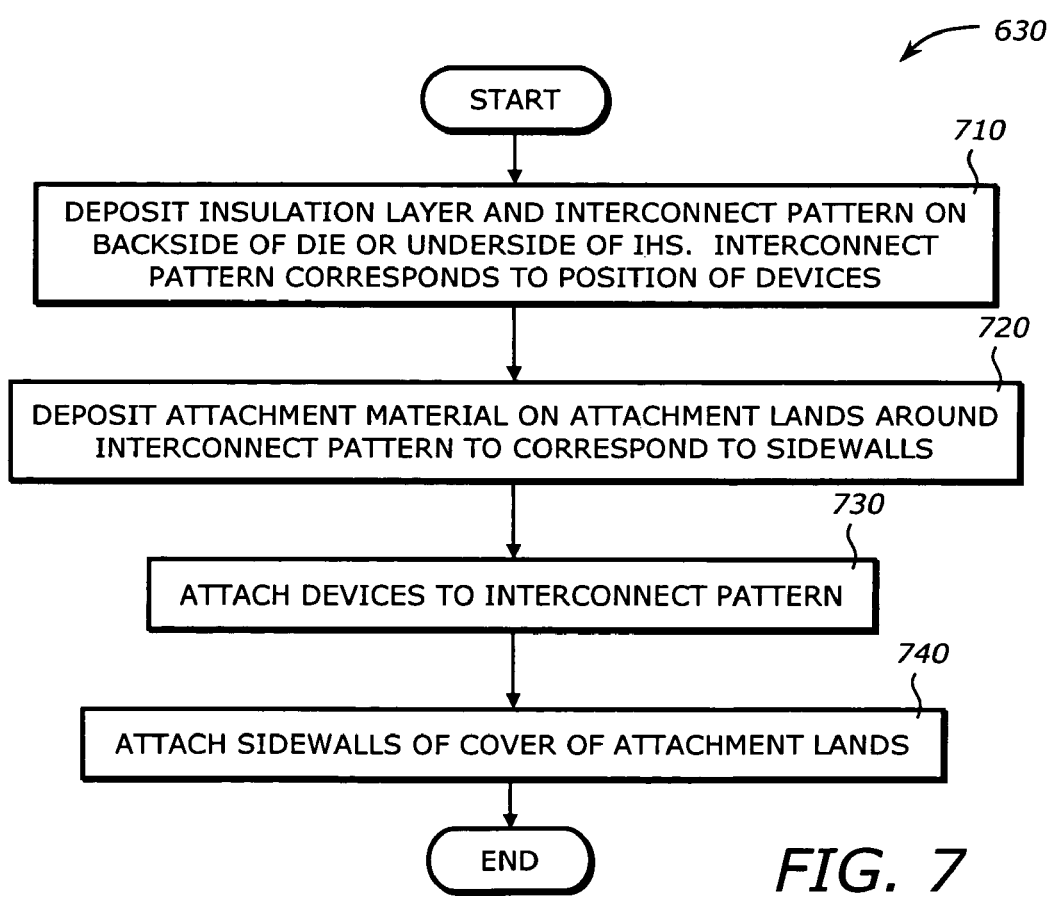
FIG. 7 is a flowchart illustrating a process to attach the cover assembly according to one embodiment of the invention.

FIG. 7 is a flowchart illustrating a process 630 to attach the cover assembly according to one embodiment of the invention Upon START, the process 630 deposits an insulation layer and an interconnect pattern on the backside of the die or on the underside of the IHS (Block 710). The interconnect pattern corresponds to position of the devices. For thermal applications, the devices may be the TFTECs and the interconnect pattern is placed at a hotspot or hotspots of the backside of the die or a strategic location on the underside of the IHS. Leads may be plated or sputtered and pass under the edge of the cover to provide power to the devices.

Next, the process 630 deposits or dispenses attachment material on attachment lands around the interconnect pattern to correspond to the sidewalls (Block 720). The attachment material may be solder, epoxy, or glue sealant.

Then, the process 630 attaches the devices to the interconnect pattern (Block 730) using a layer of solder dispensed on the interconnect pattern. Next, the process 630 attaches the sidewalls of the cover to the attachment lands (Block 740). The process 630 is then terminated.

Embodiments of the invention have been described with a cover assembly having a number of devices. For thermal applications, the devices may be TFTECs. Any external devices other than TFTECs may be attached to the surface of the cover such as a moisture sensor, pressure sensor, etc.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    forming a cover having a base plate and sidewalls attached to perimeter of the base plate, the sidewalls having a height;
    attaching a plurality of devices to underside of the base plate, the devices having length corresponding to the height; and
    attaching the cover to a surface after attaching the devices to the underside of the base plate such that the devices are sealed within the cover; wherein attaching the plurality of devices comprises:
    attaching the plurality of devices, the devices being thin film thermo-electric coolers (TFTECs).

2. The method of claim 1 wherein attaching the cover comprises:
    attaching the cover to backside of a die or to underside of an integrated heat spreader (IHS).

3. The method of claim 1 wherein attaching the cover further comprises:
    depositing an interconnect pattern on the backside of the die or on the underside of the IHS, the interconnect pattern corresponding to position of the devices; and
    depositing attachment material on attachment lands around the interconnect pattern to correspond to the sidewalls;
    attaching the devices to the interconnect pattern; and
    attaching the sidewalls of the cover to the attachment lands.

4. The method of claim 3 wherein depositing the interconnect pattern on the backside of the die comprises:

depositing the interconnect pattern at locations corresponding to hotspots on the backside of the die.

5. The method of claim 1 wherein forming the cover comprises:
forming the cover having the base plate made of a thermally conductive material.

6. The method of claim 1 wherein forming the cover comprises:
forming the cover having the base plate made of a first material and the sidewalls made of a second material.

7. The method of claim 1 wherein the TFTECs are separated by a gap.

8. The method of claim 1 wherein each of the TFTECs includes an array of p-type and n-type semiconductor elements that act as two dissimilar conductors.

9. The method of claim 2 wherein each of the TFTECs has a TEC core, a cool side, and a hot side.

10. The method of claim 9 wherein each of the TFTECs, when energized, operates to transfer heat generated from the die to the cool side and out to the hot side.

11. The method of claim 9 wherein when the cover is attached to the backside of the die, the cool side is attached to an interconnect pattern on the backside of the die and the hot side is attached to the underside of the base plate.

12. The method of claim 9 wherein when the cover is attached to the underside of the IHS, the cool side is attached to the underside of the base plate and the hot side is attached to an interconnect pattern on the underside of the IHS.

\* \* \* \* \*

UNITED STATES PATENT AND TRADEMARK OFFICE
CERTIFICATE OF CORRECTION

PATENT NO. : 7,622,327 B2  Page 1 of 1
APPLICATION NO. : 11/396054
DATED : November 24, 2009
INVENTOR(S) : Chrysler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 582 days.

Signed and Sealed this

Twenty-sixth Day of October, 2010

David J. Kappos
*Director of the United States Patent and Trademark Office*